US006856631B1

(12) United States Patent
Takahashi

(10) Patent No.: US 6,856,631 B1
(45) Date of Patent: Feb. 15, 2005

(54) SEMICONDUCTOR DEVICE WITH SATURABLE ABSORBING LAYER

(75) Inventor: Takashi Takahashi, Sendai (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 09/408,437

(22) Filed: Sep. 29, 1999

(30) Foreign Application Priority Data

Sep. 30, 1998 (JP) .......................... 10-293105

(51) Int. Cl.⁷ ........................... H01S 3/113; H01S 5/00
(52) U.S. Cl. ......................... 372/11; 372/43; 372/45; 372/46; 372/50
(58) Field of Search ................. 372/11, 25, 26, 372/30, 39, 29.02, 43, 45, 46, 50, 18, 19, 44; 257/97, 103

(56) References Cited

U.S. PATENT DOCUMENTS 4,713,493 A * 12/1987 Ovshinsky .............. 136/249
5,974,069 A * 10/1999 Tanaka et al. ............. 372/46
6,118,800 A * 9/2000 Kidoguchi et al. ........ 372/46
6,121,634 A * 9/2000 Saito et al. ............... 257/86
6,358,822 B1 * 3/2002 Tomomura ............... 438/483
6,456,640 B1 * 9/2002 Okumura ................. 372/46

FOREIGN PATENT DOCUMENTS

JP 9283840 10/1997
JP 9331098 12/1997

* cited by examiner

Primary Examiner—Mingun Oh Harvey
Assistant Examiner—Armando Rodriguez
(74) Attorney, Agent, or Firm—Cooper & Dunham LLP

(57) ABSTRACT

A self-pulsating semiconductor laser device includes a semiconductor substrate of the first conductivity type, a first cladding layer of the first conductivity type formed on the substrate and an active layer formed on the first cladding layer. A second cladding layer of a second conductivity type is formed on the active layer. A saturable absorbing layer is formed on at least portions of at least one of the first cladding layer and the second cladding layer. The saturable absorbing layer has a band gap energy either approximately the same as, or slightly smaller than, the active layer.

15 Claims, 5 Drawing Sheets

SEMICONDUCTOR DEVICE WITH SATURABLE ABSORBING LAYER

BACKGROUND

1. Field

This patent specification relates to a semiconductor device and, more particularly, to a self-pulsating semiconductor laser device incorporating a saturable absorbing layer having controlled band gap energy and carrier lifetime, and being capable of providing self-pulsation for use in, for example, optical disk systems.

2. Description

Semiconductor lasers incorporating AlGaInP alloy layers are promising devices for use in, for example, optical disk systems for shorter wavelength light emissions. In the optical disk applications of the laser diodes, optical feedback can be a source of excessive noise. One way to avoid the noise is to modulate the laser output at a high pulse repetition rate. This can be achieved by adding a modulator at the cost of complicating the circuit. Alternately, one may utilize to induce self-pulsations by including a saturable absorber in the cavity.

As an example, a self-pulsating laser device is disclosed in Japanese Laid-Open Patent Application 9-283840. Referring to FIG. 4, the laser device is fabricated on an n-GaAs substrate 1 having the direction normal to the surface thereof misoriented by approximately 10° from the direction normal to the (100) plane toward the <011> direction, with the following layers contiguously formed thereon in the order recited:

an n-GaAs buffer layer 2,
an n-AlGaInP cladding layer 3,
an active region 4 of a multi-quantum well (MQW) structure including AlGaInP and GaInP layers,
a p-AlGaInP first cladding layer 5,
a p-GaInP saturable absorbing layer 6, and
a p-AlGaInP second cladding layer 7.

Further, a ridge stripe is formed of the top portion of the p-AlGaInP second cladding layer 7 extending longitudinally to an optical cavity. A contact layer 8 is then formed on top of the ridge stripe portion of the second cladding layer 7. Subsequently, a current confinement layer 9 is formed flanking the both sides of the second cladding layer 7 and the contact layer 8, and a p-GaAs capping layer 10 is further formed on both the contact layer 8 and the current confinement layer 9.

A positive electrode 11 was subsequently formed on the capping layer 10, while a negative electrode 12 was formed on the rear side of the substrate 1.

Although the saturable absorbing layer 6 and the active layers 4 have the same GaInP composition in this disclosure, the band gap energy of the former has been made smaller by 80 meV than the latter. This is achieved by rendering the crystalline property to be ordered for the former 6, while to be disordered for the latter 4. With the thus prepared structure, the saturable absorbing layer 6 is able to absorb light emissions from the active layer efficiently and the light absorption can be made saturated, to thereby be able to achieve stable self-pulsations.

As another example, a further self-pulsating laser device is disclosed in Japanese Laid-Open Patent Application 9-331098. Referring to FIG. 5, the laser device is fabricated on an n-GaAs substrate 21 with the following layers contiguously formed thereon in the order recited:

an n-GaAs buffer layer 22,
an n-AlGaInP cladding layer 23,
an active layer 24,
a p-AlGaInP cladding layer 25,
a p-AlGaInP saturable absorbing layer 26,
a p-AlGaInP cladding layer 27,
a p-GaInP hetero-buffer layer 28, and
a p-GaAs capping layer 29.

Subsequently, portions of the p-GaInP hetero-buffer layer 28 and the p-GaAs capping layer 29 are removed to be formed thereto an n-GaAs current confinement layer 30, and a p-GaAs capping layer 31 is further formed on top of both the p-GaAs capping layer 29 and the n-GaAs current confinement layer 30.

A positive electrode 32 is subsequently formed on the p-GaAs capping layer 31, while a negative electrode 33 is formed on the rear side of the substrate 21.

In this disclosure, the saturable absorbing layer 26 is doped with a minute amount of oxygen (i.e., $3 \times 10^{17}$ cm$^{-3}$) in addition to p-type dopants, Zn, with the concentration of $3 \times 10^{18}$ cm$^{-3}$.

With this oxygen doping, the number of non-radiative recombination centers increases. This results in the expense of minority carriers and also the decrease in carrier life time, to thereby be able to achieve stable self-pulsations.

The pulsating characteristics are known to be affected strongly by the structure parameters and operating temperatures, and several shortcomings have been realized in known laser devices described above.

For example, in the device shown in FIG. 4, the saturable absorbing layer 6 is formed to be in an ordered state and additionally added with the level of dopants of as high as $2 \times 10^{18}$ cm$^{-3}$. Since the dopants tends to diffuse because of this high doping level, the ordered state is gradually transformed to a disordered state. With progress of the disordered structure in the saturable absorbing layer, the difference in the band gap energy from the active layer decreases, to thereby cause failures in stable self-pulsations.

Also, in the device shown in FIG. 5, the saturable absorbing layer 26 is formed being doped with a minute amount of oxygen in order to decrease carrier life time. However, crystalline properties of the Al containing alloy systems such as AlGaInP tend to be degraded by residual oxygen atoms from the reaction chamber and source materials, because of the highly reactive nature of Al.

This degradation may be obviated by increasing the Al content in the AlGaInP saturable absorbing layer 26. Specifically, since the rate of the oxygen doping increases with the increase in the Al content, carrier life time may decrease with a relatively small supplying rate of oxygen. However, in order the band edge wavelength of the saturable absorbing layer 26 be approximately the same as the active layer, this gives rise to another problem, in that the saturable absorbing layer has to be formed including an increased amount of In and thereby accommodating excessive compressive strains.

SUMMARY OF THE DISCLOSURE

Accordingly, it is an object of the present disclosure to provide improved semiconductor devices including improved self-pulsating semiconductor laser devices using semiconductor layered structures, having most, if not all, of the advantages and features of similar employed structures and devices, while eliminating many of the aforementioned disadvantages.

It is another object of the present disclosure to provide a self-pulsating semiconductor laser device comprising a semiconductor substrate of a first conductivity type, a first cladding layer of the first conductivity type formed on the semiconductor substrate and an active layer formed on the first cladding layer. A second cladding layer of a second conductivity type is formed on the active layer, and a saturable absorbing layer is formed on at least portions of at least one of the first and second cladding layers. The saturable absorbing layer is formed to preferably have a band gap energy either approximately the same as, or slightly smaller than, the active layer, and also to be doped with a high concentration of N.

It is still another object of the present disclosure to provide the self-pulsating semiconductor laser device, wherein the saturable absorbing layer comprises N as the group-V element.

It is another object of the present disclosure to provide the self-pulsating semiconductor laser device, wherein the active layer, first and second cladding layers and saturable absorbing layer comprise AlGaInP alloy materials.

It is another object of the present disclosure to provide the self-pulsating semiconductor laser device, wherein an AlGaInP intermediate layer is interposed between the AlGaInP cladding layer and the saturable absorbing layer such that the intermediate layer contains less Al than the cladding layer and no N.

With the layered structure of the self-pulsating semiconductor laser device disclosed herein, stable self-pulsations can be achieved to be appropriately for use in, for example, optical disk systems.

BRIEF DESCRIPTION OF THE DRAWINGS

The present disclosure together with its various features and advantages, can be more easily understood from the following more detailed description taken in conjunction with the accompanying drawings in which.

DESCRIPTION OF THE ILLUSTRATIVE EMBODIMENTS

In the description which follows, specific embodiments particularly useful in self-pulsating laser device applications are described. It is understood, however, that the present disclosures are not limited to these embodiments. For example, it is appreciated that semiconductor alloy materials and their layered structures disclosed herein are adaptable to other various forms of semiconductor devices. Other embodiments will be apparent to those skilled in the art.

Figure 1:
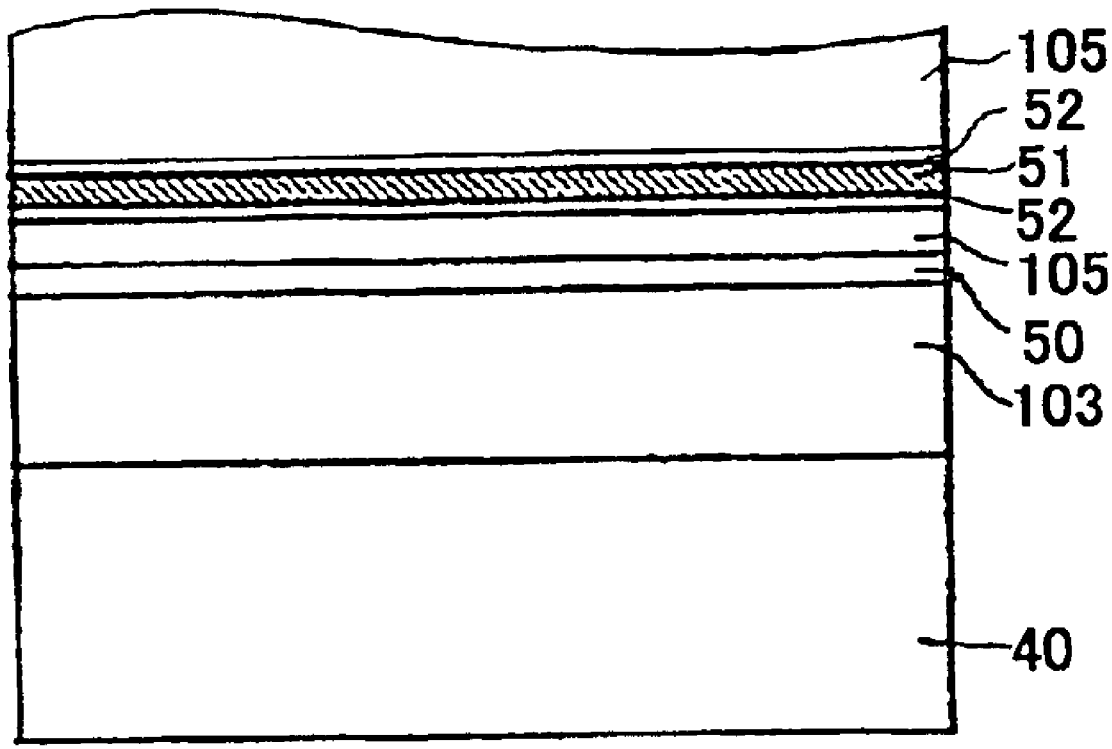
FIG. 1 is a cross sectional view of an illustrative embodiment of a self-pulsating laser device structure disclosed herein.

FIG. 1 is a cross sectional view of an illustrative embodiment of a self-pulsating semiconductor laser device structure disclosed herein.

Referring to FIG. 1, the device structure is formed on a semiconductor substrate 40 of the first conductivity type with layers grown contiguously thereon in the order of, from the substrate, a cladding layer 103 of the first conductivity type, an active layer 50, another cladding layer 105 of the second conductivity type, and a saturable absorbing layer 51.

Although the saturable absorbing layer 51 is formed on top of the cladding layer 105 of the second conductivity type as mentioned above, the layer 51 may alternatively be formed either on top of the cladding layer 103 (first conductivity type), or on top of both the cladding layers 105 (second conductivity type) and 103.

The saturable absorbing layer 51 is formed to have a band gap energy either approximately the same as, or a slightly smaller than, the active layer, and also to be doped with a high concentration of N.

In the present disclosure, self-pulsations in the laser device can be stabilized through doping the saturable absorbing layer 51 with a high concentration of N.

The reason for the stabilization is considered as follows: Among the group-V elements, N is known to have a relatively large non-miscibility with III-V alloy semiconductor materials containing either As or P. Therefore, by doping the As- or P-containing III-V alloy materials with N, the number of non-radiative recombination centers increases, and this causes the carrier lifetime decreased.

For example, in the InGaNAs system, the carrier lifetime decreases to be 1.2 nanosecond at the concentration of doped N of $2 \times 10^{18}$ cm$^{-3}$. With this decrease in the carrier lifetime, the saturable absorbing layer 51 was able to absorb light emissions from the active layer 50 efficiently, to thereby be able to achieve stable self-pulsations.

With a further increase in the N content, the saturable absorbing layer 51 can be considered as a N containing alloy layer. Namely, an alloy containing N as a group-V element is formed in saturable absorbing layer 51. Since the As- or P-containing III-V alloy materials are known to exhibit a relatively large bowing in band gap energy with N concentration, the alloy material containing a small amount of N has a smaller band gap energy than that without N.

The band gap energy of the saturable absorbing layer 51 can be adjusted therefore to be smaller than the active layer by adding N into the alloy which has the same composition as the active layer. Further, the amount of the decrease in the band gap energy by the N addition can be controlled with precision by the amount of N added into the layer. The light absorption by the saturable absorbing layer 51 is thereby increased and the self-pulsations can be stabilized by the layer structure accordingly.

Also, in the semiconductor laser device shown in FIG. 1, the cladding layer 103, active layer 50, and saturable absorbing layer 51 may alternatively be formed of AlGaInP alloy materials.

By constructing the structure shown in FIG. 1 with the above-mentioned AlGaInP alloy materials, namely, by composing the cladding layer, active layer, and saturable absorbing layer, of the AlGaInP alloy materials, self-pulsating laser device can be provided, which has light emissions ranging from 630 to 580 nm suitable for use in optical disk systems such as, for example, digital video disk (DVD). In addition, these materials for forming the saturable absorbing layer include N to be represented by, for example, GaInNP and AlGaInNP.

As described earlier, since N has a relative strong banding nature between Al, more N is incorporated into the saturable absorbing layer 51 by increasing the Al content in the layer 51, and this causes the increase in the band gap energy of the AlGaInP layer.

Therefore, in order for the saturable absorbing layer, which has a larger Al content than the active layer, to have approximately the same band gap energy as the active layer, the saturable absorbing layer preferably has a larger In content and also to be compressively strained.

For example, $(Al_{0.4}Ga_{0.6})_{1-a}In_aP$ layers have the same band gap energy as $Ga_{0.5}In_{0.5}$ P well layer at 0.7 of the In content, "a". This results in the compressed strain as large as 1.5%, which causes difficulties in forming the layers, having an enough thickness to achieve satisfactory light absorption for the saturable absorbing layer.

In contrast, the band gap energy in the alloy system can be decreased by the N addition. For example, with 0.5% of N, the same band gap energy as the above layer can be obtained at approximately 0.6% of In. That is, a decrease by 0.1% from the above-mentioned non-N materials can be thus obtained.

From the present example, it is indicated that the amount of the compressed strain at the same Al content can be decreased by forming the saturable absorption layer composing of AlGaInNP in place of AlGaInP. This makes it feasible the saturable absorbing layer 51 be controlled in the compressed strain and have an improved rate of the N inclusion.

The rate of the N inclusion into AlGaInP layer varies depending on the growth conditions of the layer. Therefore, the effect of the N inclusion in the AlGaInP layer on other layers can be controlled by appropriately choosing the growth conditions.

In the laser device of the present embodiment shown in FIG. 1, an intermediate layer is interposed between the AlGaInP cladding layer 105 and the AlGaInNP saturable absorbing layer 51 such that the intermediate layer 52 contains less Al than the cladding layer and contains no N.

The effect of forming the intermediate layer are as follows.

The Al content in the cladding layer 105 is usually higher than the saturable absorbing layer 51. Therefore, without the intermediate layer, an undesirably high N concentration results in the interface region between the cladding layer 105 and the saturable absorbing layer 51. With the N content in excess of several percents, cloudiness is caused on the surface of growing layers, to thereby result in degraded laser device characteristics.

In contrast, by interposing the intermediate layer 52 between the cladding layer and the saturable absorbing layer such that the intermediate layer contains less Al than the cladding layer, the N segregation in the interface region can be prevented and the surface properties of the growing layers are improved, to thereby be able to obviate the degradation in the device characteristics.

With thus fabricated self-pulsating laser devices incorporating the saturable absorbing layers disclosed herein, improved optical disk systems can be provided having low noise readout characteristics.

The following examples are provided further to illustrate preferred embodiments disclosed herein. This is intended to be illustrative but not to be limiting to the materials, processes or devices described herein.

EXAMPLE

Example 1

A self-pulsating semiconductor laser device was fabricated according to an embodiment disclosed herein.

Figure 2:
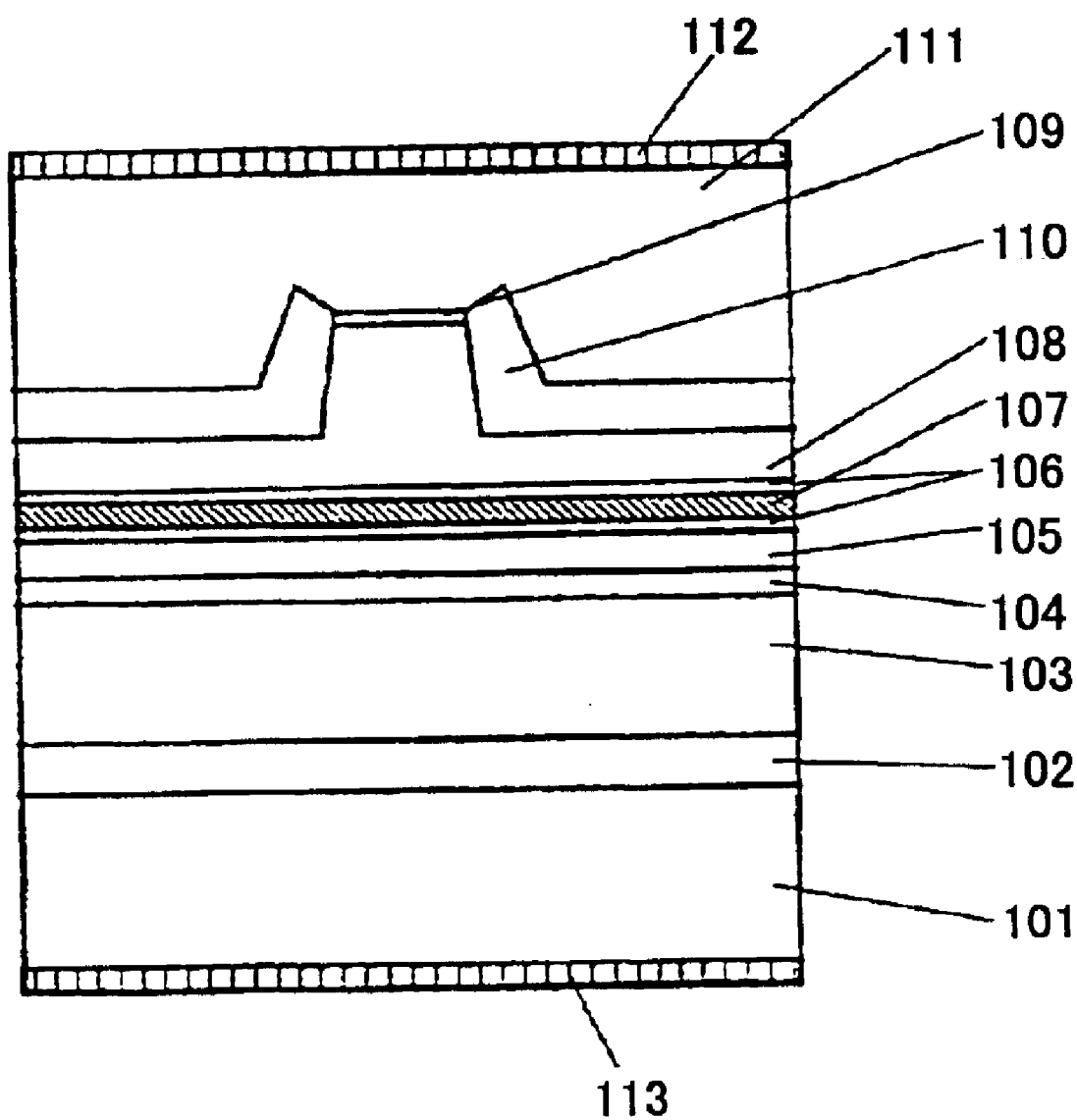
FIG. 2 is a cross-sectional view of another embodiment of the self-pulsating laser device disclosed herein.

Referring to FIG. 2, the self-pulsating laser device was formed on an n-GaAs substrate 101 with the following layers grown contiguously thereon, in the order recited:

an n-GaAs buffer layer 102, an n-$(Al_{0.7}Ga_{0.3})_{0.5}In_{0.5}P$ cladding layer 103, a $Ga_{0.5}In_{0.5}P$ active layer 104, a p-$(Al_{0.5}Ga_{0.3})_{0.5}In_{0.5}P$ first cladding layer 105, a p-$Ga_{0.5}In_{0.5}P$ intermediate layer 106, p-$Ga_{0.5}In_{0.5}NP$ saturable absorbing layer 107, another p-$Ga_{0.5}In_{0.5}P$ intermediate layer 106, a p-$(Al_{0.7}Ga_{0.3})_{0.5}In_{0.5}$ P second cladding layer 108, and a p-$Ga_{0.5}In_{0.5}P$ contact layer 109.

Subsequently, both p-$Ga_{0.5}In_{0.5}P$ contact layer 109 and p-$(Al_{0.7}Ga_{0.3})_{0.5}In_{0.5}P$ second cladding layer 108 were mesa etched to form a stripe using known dry etch techniques. Further, an n-GaAs current confinement layer 110 was then formed flanking the mesa etched sides of these layers 109 and 108. In addition, on top of the p-$Ga_{0.5}In_{0.5}P$ contact layer 109 and n-GaAs current confinement layer 110, a p-GaAs capping layer 111 was formed.

A positive electrode 112 was formed subsequently on the p-GaAs capping layer 111, while a negative electrode 113 was formed on the rear side of the n-GaAs substrate 101.

For forming the laser device the n-GaAs substrate was chosen so that the direction normal to the surface thereof was misoriented by approximately 15° from the direction normal to the (100) plane toward the <011> direction, and the compositional layers were grown by low pressure MOCVD.

The saturable absorbing layer 107 was formed to have the same composition as that of the $Ga_{0.5}In_{0.5}P$ active layer 104 and additionally doped with N of the content of $5 \times 10^{19}$ cm$^{-3}$. The source materials used for forming the saturable absorbing layer were trimethylgallium (TMG) for Ga, trimethylindium (TMI) for In and phosphine (PH$_3$) for P. In addition, dimethylhydrazine (DMHy) was used for the N doping, and the N content in the $Ga_{0.5}In_{0.5}(N)P$ layer was able to be varied by adjusting the feeding rate of dimethylhydrazine (DMHy). In order to render the saturable absorbing layer 107 to be of p-type, the layer was further doped with Zn of the content of $1 \times 10^{18}$ cm$^{-3}$.

The band gap energy of the GaInNP layer was decreased by the N doping from that of prior to the doping. Specifically, by the N doping of $5 \times 10^{19}$ cm$^{-3}$, the band gap energy thereof was decreased by 40 meV. The amount of the band gap energy decrease was thus controlled by the amount of doped N with relative ease.

In addition, since the quaternary GaInNP material has a relatively large non-miscibility, its crystalline properties tend to be degraded by the addition of N. Further, in order to incorporate N with more ease during the MOCVD growth of the $Ga_{0.5}In_{0.5}NP$ layer under reduced pressure conditions, the feeding rate of the P source material was decreased from that in ordinary P doping processes. This gave rise to an increase in the number of non-radiative recombination centers and a decrease in carrier lifetime in the saturable absorbing layer 107.

As described above, the band gap energy of the GaInNP saturable absorbing layer 107 was smaller by 40 meV than that of the $Ga_{0.5}In_{0.5}P$ active layer 104 and the carrier lifetime decreased in the layer 107. Therefore, the saturable absorbing layer 107 was able to absorb light emissions from the active layer 104 efficiently, to thereby be able to achieve stable self-pulsations.

In addition, in the laser device in this embodiment, the first p-$Ga_{0.5}In_{0.5}P$ intermediate layers 106, having a thickness of 2 nm, was interposed between the $Ga_{0.5}In_{0.5}NP$ saturable absorbing layer 107 and the $p-(Al_{0.7}Ga_{0.3})_{0.5}In_{0.5}P$ first cladding layer 105, while the second $p-Ga_{0.5}In_{0.5}P$ intermediate layers 106, having a thickness of 2 nm, was interposed between the $Ga_{0.5}In_{0.5}NP$ saturable absorbing layer 107 and the $p-(Al_{0.7}Ga_{0.3})_{0.5}In_{0.5}P$ first cladding layer 108.

It has been known that the rate of N inclusion is increased with the increase in the Al content. Therefore, if a saturable absorbing layer 107 is formed of the $Ga_{0.5}In_{0.5}NP$ layer doped with $5 \times 10^{19}$ $cm^{-3}$ of N such as aforementioned, directly on top of the $p-(Al_{0.7}Ga_{0.3})_{0.5}In_{0.5}P$ first cladding layer 105, the saturable absorbing layer tends to incorporate excessive N atoms at the layer portions formed at initial stages of the layer growth in the vicinity of the first cladding layer 105, to thereby induce undesirable cloudiness. This is also true for the combination of the saturable absorbing layer 107 and the second cladding layer 108.

It should be noted stressed that the above growth of the saturable absorbing layer 107 is assumed to be carried out directly on top of the Al containing first or second cladding layers 105, 108 without an interposing intermediate layer. In contrast, in the present embodiment of the laser device shown in FIG. 2, the intermediate layer 106 was interposed being composed of $Ga_{0.5}In_{0.5}P$. Since this intermediate layer contained less Al than the cladding layer and contained no N, the undesirable N segregation on the surface portions of the saturable absorbing layer 107 in the vicinity of the first cladding layer 105 could be thus prevented.

In a similar manner, the undesirable N segregation on the surface portions of the saturable absorbing layer 107 in the vicinity of the second cladding layer 108 could thus be prevented by interposing another intermediate layer 106 therebetween.

Example 2

A further self-pulsating semiconductor laser device was fabricated according to another embodiment disclosed herein.

Figure 3:
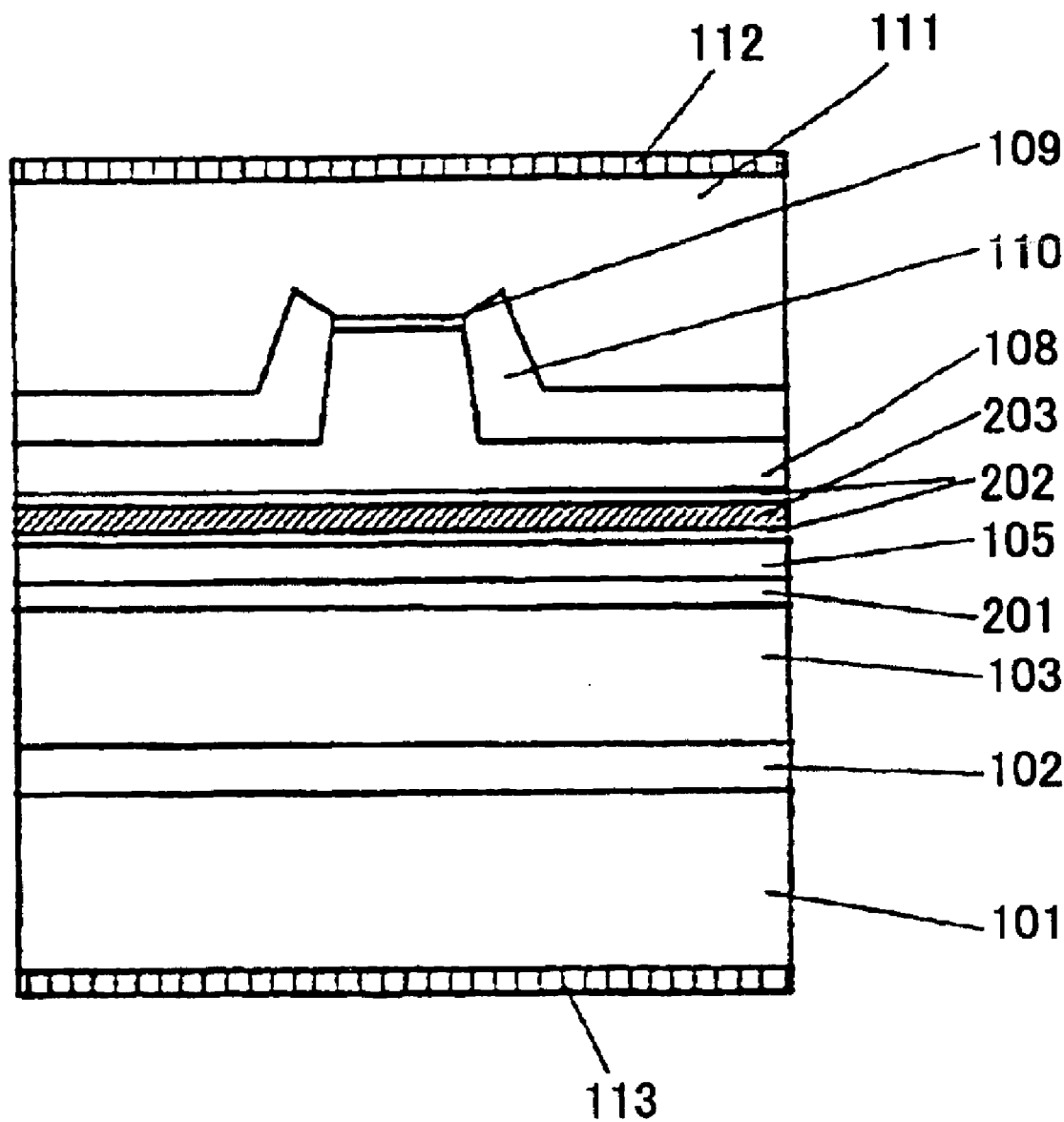
FIG. 3 is a cross-sectional view of another embodiment of the self-pulsating laser device disclosed herein.
Figure 4:
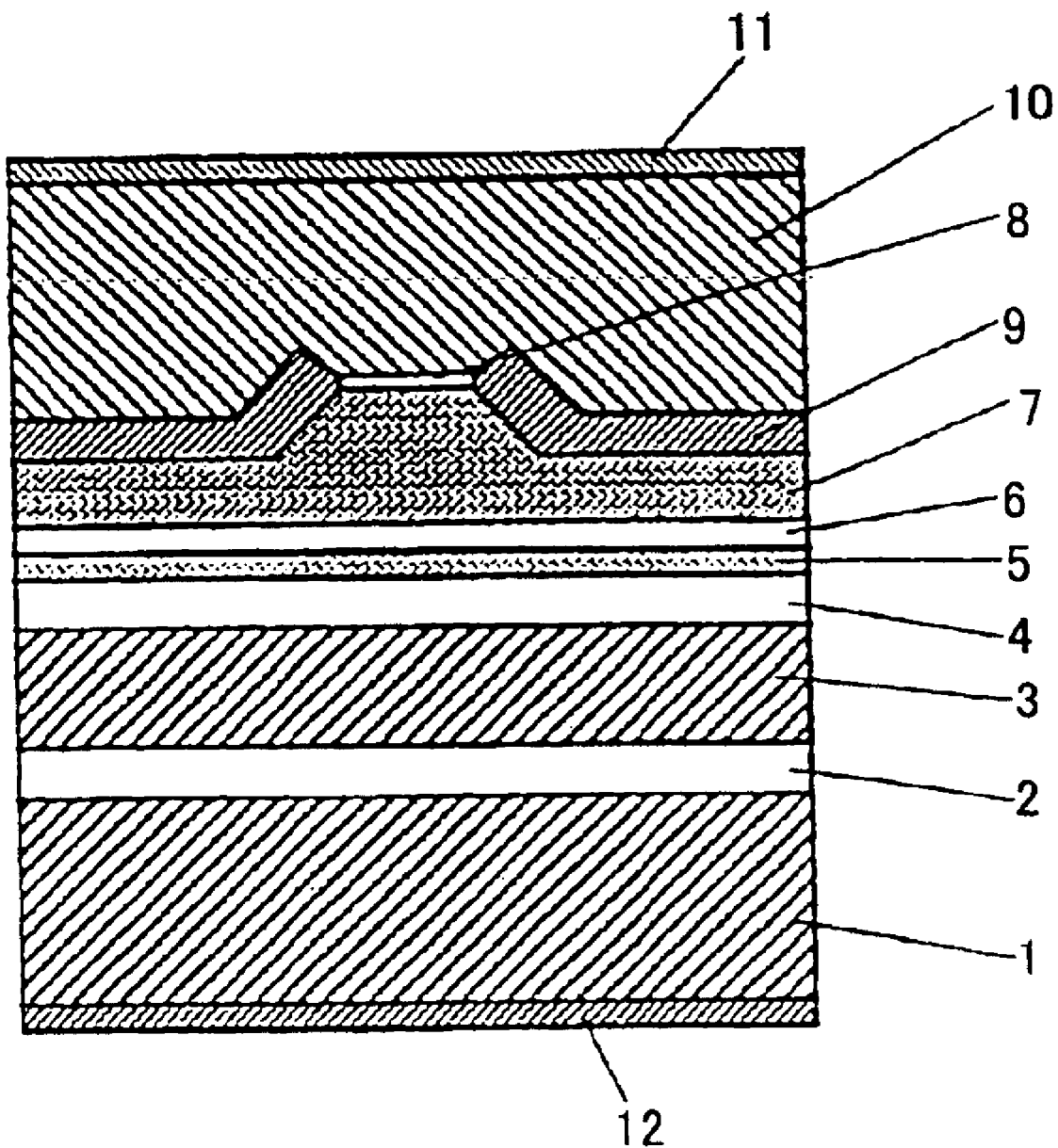
FIG. 4 is a cross-sectional view of a prior art self-pulsating laser device.
Figure 5:
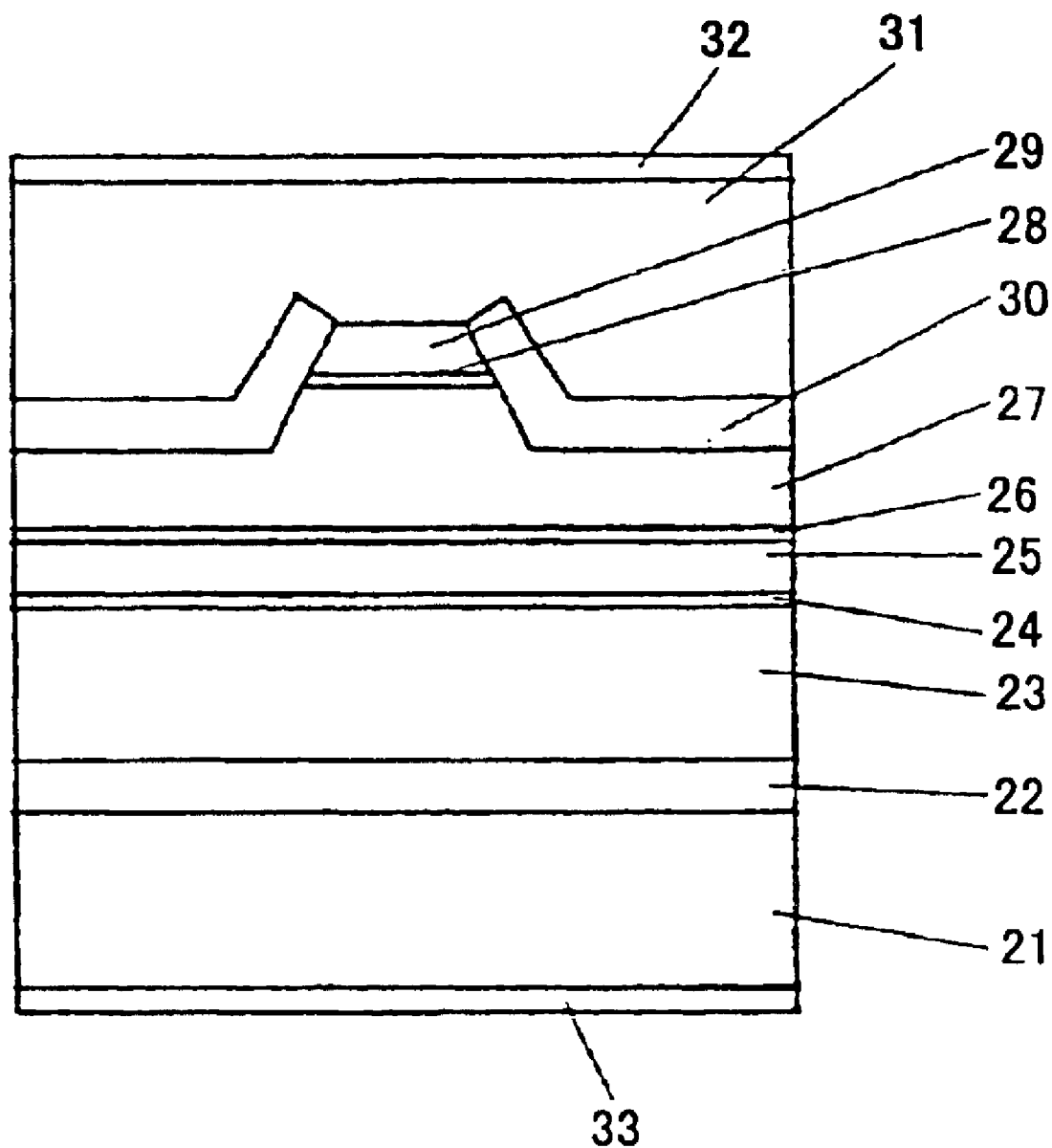
FIG. 5 is a cross-sectional view of another prior art self-pulsating laser device.

Referring to FIG. 3, another self-pulsating laser device was formed in similar manner to Example 1, with the exception that the active region 201 was of a MQW structure including two or more $Ga_{0.5}In_{0.5}P$ well layers and $(Al_{0.5}Ga_{0.5})_{0.5}In_{0.5}P$ barrier layers interposed therebetween; and that the p type saturable absorbing layer 203 was of a MQW structure including two or more $(Al_{0.4}Ga_{0.6})_{0.4}In_{0.6}NP$ well layers and $(Al_{0.7}Ga_{0.3})_{0.5}In_{0.5}P$ barrier layers interposed therebetween.

The band gap energy of the AlGaInP layer increases with the increase in Al content. Therefore, in order for the saturable absorbing layer, which has a larger Al content than the active layer, to have approximately the same band gap energy as the active layer, the saturable absorbing layer preferably has a large In content and also to be compressively strained.

Namely, in order to have approximately the same band gap energy as the $Ga_{0.5}In_{0.5}P$ well layer in the active layer 201 in the present laser device shown in FIG. 3, the saturable absorbing layer 203 was formed to have an In content of 0.6, and to be compressively strained. In addition, the saturable absorbing layer 203 included 0.5% of N as the group-V element. Since the band gap energy generally decreases with the N addition, as described earlier, the band gap energy of the above-mentioned N containing saturable absorbing layer 203 was decreased by about 80 meV from that without N addition. This result in the amount of the compressive strains decreased to be about 1%.

Since N has a rather strong in the bonding between Al, as described earlier, by forming the well layers to have a larger Al content than 0.4 in the saturable absorbing layer 203, the N addition could be carried out more efficiently than the $Ga_{0.5}In_{0.5}P$ saturable absorbing layer 107 described previously in Example 1.

As indicated earlier, the number of non-radiative recombination centers and the carrier lifetime decreases accordingly in the $(Al_{0.4}Ga_{0.6})_{0.4}In_{0.6}NP$ well layers in the saturable absorbing layer 203 having a N content of 0.5%. In addition, since Al is additionally included as a constitutional element, there may be incorporated into the layers are not only N, but residual oxygen atoms in the reaction chamber and source materials.

With the above-mentioned decrease in the carrier lifetime, therefore, the saturable absorbing layer 107 is able to absorb light emissions from the active layer efficiently, to thereby be able to achieve stable self-pulsations.

Further, in the laser device shown in FIG. 3, the $p-(Al_{0.7}Ga_{0.3})_{0.5}In_{0.5}P$ first cladding layer 105 and the saturable absorbing layer 203 was interposed by the $p-(Al_{0.4}Ga_{0.6})_{0.4}In_{0.6}P$ intermediate layer 202 having a thickness of 2 nm. In a similar manner, the $p-(Al_{0.7}Ga_{0.3})_{0.5}In_{0.5}P$ second cladding layer 105 and the saturable absorbing layer 203 was interposed by the other $p-(Al_{0.4}Ga_{0.6})_{0.4}In_{0.6}P$ intermediate layer 202 having a thickness of 2 nm.

With these intermediate layers, the undesirable N segregation on the surface portions of the saturable absorbing layer 203 in the vicinity of the cladding layers 105, 108 can thus be prevented.

Although the AlGaInP system was chosen and discussed primarily as the semiconductor material for forming compositional layers of the self-pulsating laser device, other III-V alloy materials may also be adopted, such as, for example, AlGaAs and InGaAs.

Furthermore, although the saturable absorbing layer is formed in the p-type cladding layer region in the embodiment of the invention, the saturable absorbing layer may alternately be formed in either the n-type cladding layer region or both the n- and p-type cladding layer regions.

With the layered structure of the self-pulsating semiconductor laser device disclosed herein, stable self-pulsations thus become feasible, to thereby appropriately be used in, for example, optical disk systems.

This document claims priority and contains subject matter related to Japanese Patent Application 10-293105 filed with the Japanese Patent Office on Sep. 30, 1998, the entire contents of which are hereby incorporated by reference.

Although there have been described what are at present considered to be the preferred embodiment of the invention, it will be understood those disclosed herein may be embodied in other specific forms without departing from the essential characteristic thereof. The present embodiments are therefore considered in all respect as illustrative, and not restrictive. This scope of the invention is indicated by the appended claims rather than by foregoing description.

What is claimed is:

1. A semiconductor device comprising:
   a semiconductor substrate of a first conductivity type;
   a first cladding layer of said first conductivity type formed on said semiconductor substrate;
   an active layer formed on said first cladding layer;
   a second cladding layer of a second conductivity type formed on said active layer; and
   a saturable absorbing layer formed on at least portions of at least one of said first cladding layer and said second cladding layer;

wherein said saturable absorbing layer is formed to have a band gap energy either approximately the same as, or slightly smaller than, said active layer, and also to be doped with nitrogen (N) in an amount sufficient to form a localized level;

wherein said saturable absorbing layer includes a III-V alloy material; and wherein said saturable absorbing layer comprises at least one of As and P.

2. A semiconductor device a comprising a semiconductor substrate of a first conductivity type;

a first cladding layer of said first conductivity type formed on said semiconductor substrate;

an active layer formed on said first cladding layer;

a second cladding layer of a second conductivity type formed on said active layer; and a saturable absorbing layer formed on at least portions of at least one of said first cladding layer and said second cladding layer;

wherein said saturable absorbing layer is formed to have a band gap energy either approximately the same as, or slightly smaller than, said active layer, and also to be doped with nitrogen (N) in an amount sufficient to form a localized level;

wherein said saturable absorbing layer includes a III-V alloy material; and wherein said saturable absorbing layer comprises an AlGaInNP alloy material.

3. A semiconductor device comprising:

a semiconductor substrate of a first conductivity type;

a first cladding layer of said first conductivity type formed an said semiconductor substrate;

an active layer formed on said first cladding layer;

a second cladding layer of a second conductivity type formed on said active layer; and a saturable absorbing layer formed on at least portions of at least one of said first cladding layer and said second cladding layer;

wherein said saturable absorbing layer is a mixed crystal of nitrogen (N) with another group-V element and is formed to have a band gap energy either approximately the same as, or slightly smaller than, said active layer.

4. The semiconductor device according to claim 3, wherein said saturable absorbing layer comprises at least one of As and P.

5. The semiconductor device according to claim 3, wherein said active layer, and said first and second cladding layers comprise AlGaInP alloy materials.

6. The semiconductor device according to claim 3, wherein said saturable absorbing layer comprises an AlGaInNP alloy material.

7. The semiconductor device according to claim 3, wherein said cladding layer comprises AlGaInP and wherein an AlGaInP intermediate layer is interposed between said cladding layer and said saturable absorbing layer, said intermediate layer containing less Al than said cladding layer and no nitrogen.

8. The semiconductor device according to claim 3, wherein said semiconductor device comprises a self-pulsating semiconductor laser device.

9. A semiconductor device comprising:

a semiconductor substrate of a first conductivity type;

a first cladding layer of said first conductivity type formed on said semiconductor substrate;

an active layer formed on said first cladding layer;

a second cladding layer of a second conductivity type formed on said active layer; and a saturable absorbing layer formed on at least portions of at least one of said first cladding layer and said second cladding layer;

wherein said saturable absorbing layer is formed to have a band gap energy either approximately the same as, or slightly smaller than, said active layer, and also to be doped with nitrogen (N) in an amount sufficient to form a localized level; and said saturable absorbing layer comprises at least one of As and P.

10. A semiconductor device comprising:

a semiconductor substrate of a first conductivity type;

a first cladding layer of said first conductivity type formed on said semiconductor substrate;

an active layer formed on said first cladding layer;

a second cladding layer of a second conductivity type formed on said active layer, and a saturable absorbing layer formed on at least portions of at least one of said first cladding layer and said second cladding layer;

wherein said saturable absorbing layer is a mixed crystal of nitrogen (N) with another group-V element, and a band gap of said mixed crystal of nitrogen (N) with another group-V element is reduced by adding nitrogen; and said saturable absorbing layer is formed to have a band gap energy either approximately the same as, or slightly smaller than, said active layer.

11. The semiconductor device according to claim 9, wherein said first cladding layer and said second cladding layer comprise one or more group-V elements selected from a group consisting of As, P, and Sb.

12. The semiconductor device according to claim 3, wherein said first cladding layer and said second cladding layer comprise one or more group-V elements selected from a group consisting of As, P, and Sb; and said first cladding layer and said second cladding layer do not substantially include nitrogen.

13. The semiconductor device according to claim 9, wherein said cladding layer comprises AlGaInP and wherein an AlGaInP intermediate layer is interposed between said cladding layer and said saturable absorbing layer.

14. The semiconductor device according to claim 9, wherein said semiconductor device is a self-pulsating semiconductor laser device.

15. The semiconductor device according to claim 9, wherein said active layer, and said first and second cladding layers comprise AlGaInP alloy materials.

* * * * *